(12) United States Patent
Boyle et al.

(10) Patent No.: US 12,266,629 B2
(45) Date of Patent: Apr. 1, 2025

(54) BALL BOND IMPEDANCE MATCHING

(71) Applicant: Raytheon Company, Arlington, VA (US)

(72) Inventors: Patrick E. Boyle, Dorchester, MA (US); James E. Benedict, Chelmsford, MA (US); Erika Klek, Wilmington, MA (US); Mikhail Pevzner, Woburn, MA (US)

(73) Assignee: Raytheon Company, Arlington, VA (US)

( * ) Notice: Subject to any disclaimer, the term of this patent is extended or adjusted under 35 U.S.C. 154(b) by 6 days.

(21) Appl. No.: 17/169,098

(22) Filed: Feb. 5, 2021

(65) Prior Publication Data

US 2022/0254750 A1 Aug. 11, 2022

(51) Int. Cl.
*H01L 23/00* (2006.01)

(52) U.S. Cl.
CPC ............. *H01L 24/48* (2013.01); *H01L 24/85* (2013.01); *H01L 2224/48225* (2013.01); *H01L 2224/48482* (2013.01); *H01L 2224/85047* (2013.01)

(58) Field of Classification Search
CPC ............................................... H01L 2224/8503
See application file for complete search history.

(56) References Cited

U.S. PATENT DOCUMENTS

| | | | |
|---|---|---|---|
| 3,400,358 A | 9/1968 | Byrnes et al. | |
| 4,630,172 A | 12/1986 | Stenerson et al. | |
| 4,953,060 A | 8/1990 | Lauffer et al. | |
| 5,014,419 A | 5/1991 | Cray et al. | |
| 5,241,454 A | 8/1993 | Ameen et al. | |
| 5,266,912 A | 11/1993 | Kledzik | |
| 5,485,039 A | 1/1996 | Fujita et al. | |
| 5,854,534 A | 12/1998 | Beilin et al. | |
| 6,252,779 B1 | 6/2001 | Pierson et al. | |
| 6,561,411 B2 | 5/2003 | Lee | |
| 6,729,026 B2 | 5/2004 | Garcia et al. | |
| 6,863,208 B2 | 3/2005 | Lee | |
| 7,180,167 B2 | 2/2007 | Partridge et al. | |
| 7,679,916 B2 | 3/2010 | Orr et al. | |

(Continued)

FOREIGN PATENT DOCUMENTS

| EP | 1 069 639 A2 | 1/2001 |
|---|---|---|
| EP | 2 180 505 A2 | 4/2010 |

(Continued)

OTHER PUBLICATIONS

U.S. Appl. No. 16/861,326, filed Apr. 29, 2020, Pevzner et al.

(Continued)

*Primary Examiner* — Yu-Hsi D Sun
(74) *Attorney, Agent, or Firm* — Schwegman Lundberg & Woessner, P.A.

(57) ABSTRACT

Methods and apparatus for providing an interconnection including a stack of wirebond balls having a selected impedance. The wirebond balls may have a size, which may comprise a radius, configured for the selected impedance. The stack may comprise a number of wirebond balls configured for the selected impedance and/or may comprise a material selected for the selected impedance. In embodiments, the selected impedance is primarily resistive (e.g., 50 Ohms), such that the overall reactance is minimized.

13 Claims, 6 Drawing Sheets

(56) References Cited

U.S. PATENT DOCUMENTS

| | | | |
|---|---|---|---|
| 8,138,080 | B2 | 3/2012 | Filoteo, Jr. et al. |
| 8,791,007 | B2 | 7/2014 | Tan et al. |
| 8,981,568 | B2 | 3/2015 | Rathburn |
| 10,999,938 | B1 | 5/2021 | Pevzner et al. |
| 2006/0001157 | A1* | 1/2006 | Carberry ............ H01L 23/3171 257/E23.024 |
| 2009/0032947 | A1* | 2/2009 | Na ......................... H01L 24/03 257/738 |
| 2020/0083171 | A1 | 3/2020 | Wyland |
| 2020/0174205 | A1* | 6/2020 | Kubo ................. H01L 23/49838 |
| 2021/0074668 | A1* | 3/2021 | Khalaf .................... H01L 24/49 |
| 2022/0001475 | A1* | 1/2022 | Cadalen ................... H01L 24/16 |

FOREIGN PATENT DOCUMENTS

| | | |
|---|---|---|
| EP | 2288243 A1 | 2/2011 |
| FR | 2464010 A1 | 2/1981 |
| JP | H 08-31865 A | 2/1996 |
| JP | 2001237263 A | 8/2001 |
| JP | 2005259915 A | 9/2005 |
| TW | 465064 B | 11/2001 |
| TW | M 328666 U | 3/2008 |
| TW | 2009-03676 A | 1/2009 |
| TW | I 467668 B | 1/2015 |
| TW | I 497657 B | 8/2015 |
| TW | I850595 B | 8/2024 |
| WO | WO 2014/025298 26 | 2/2014 |

OTHER PUBLICATIONS

U.S. Restriction Requirement dated Aug. 6, 2020 for U.S. Appl. No. 16/861,326; 9 Pages.

Response to U.S. Restriction Requirement dated Aug. 6, 2020 for U.S. Appl. No. 16/861,326; Response Filed Aug. 12, 2020; 1 Page.

U.S. Non-Final Office Action dated Oct. 16, 2020 for U.S. Appl. No. 16/861,326; 7 Pages.

Response to U.S. Non-Final Office Action dated Oct. 16, 2020 for U.S. Appl. No. 16/861,326; Response Filed Nov. 30, 2020; 8 Pages.

U.S. Notice of Allowance dated Feb. 2, 2021 for U.S. Appl. No. 16/861,326; 8 Pages.

International Search Report and Written Opinion dated May 12, 2021 for Application No. PCT/US2021/013847; 13 Pages.

PCT International Search Report and Written Opinion dated Feb. 9, 2022 for International Application No. PCT/US2021/056533; 22 Pages.

Taiwan Office Action (with English Translation) dated Nov. 17, 2022 for Taiwan Application No. 110140944; 13 Pages.

PCT International Preliminary Report on Patentability dated Nov. 10, 2022 for International Application No. PCT/US2021/013847; 8 Pages.

Taiwan Office Action (with English Translation) dated Mar. 27, 2023 for Taiwan Application No. 110140944; 11 Pages.

Response (with English Translation) to Taiwan $2^{nd}$ Office Action dated Mar. 27, 2023 for Taiwan Application No. 110140944; Response filed Jun. 15, 2023; 25 Pages.

Taiwan $3^{rd}$ Office Action (with English Translation) dated Jun. 20, 2023 for Taiwan Application No. 110140944; 8 Pages.

Response (with English Translation) to Taiwan Office Action dated Nov. 17, 2022 for Taiwan Application No. 110140944; Response filed Feb. 20, 2023; 28 Pages.

Taiwan Office Action (with Machine English Translation) dated Oct. 24, 2023 for Taiwan Application No. 110140944; 23 Pages.

PCT International Preliminary Report on Patentability dated Aug. 17, 2023 for International Application No. PCT/US2021/056533; 9 Pages.

Response (with Machine English Translation) to Taiwan Office Action dated Jun. 20, 2023 for Taiwan Application No. 110140944; Response Filed Aug. 24, 2023; 10 Pages.

"Japanese Application Serial No. 2023-547038, Notification of Reasons for Refusal mailed Aug. 27, 2024", w/ English translation, 6 pgs.

* cited by examiner

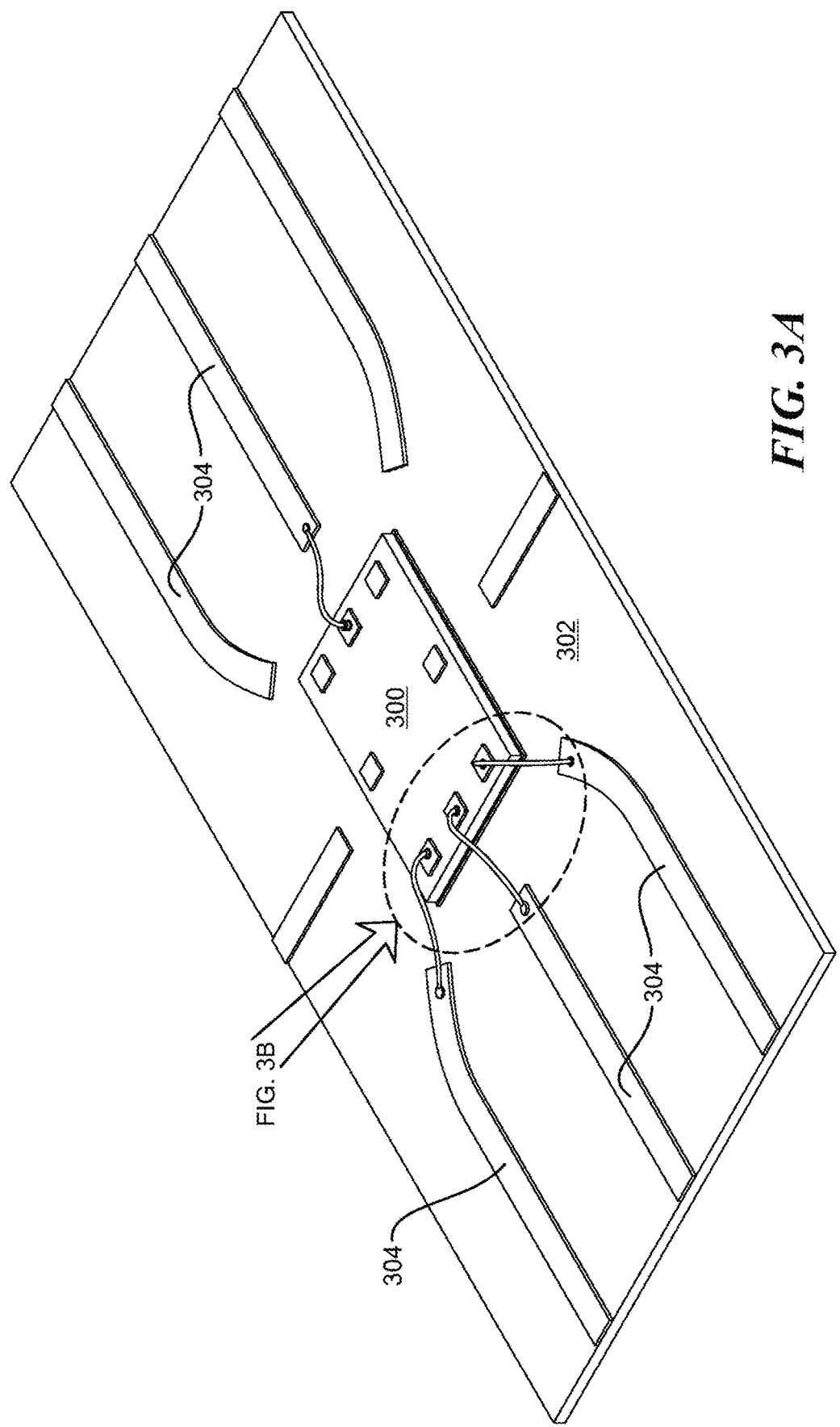

BALL BOND IMPEDANCE MATCHING

BACKGROUND

As is known in the art, circuit boards, components, connectors, and other structures may need to be mated together. Mating circuit boards may require connections from one circuit board to another. Circuit traces between a monolithic microwave integrated circuit (MMIC) and a circuit card assembly (CCA) is typically simulated prior to fabrication to ensure that the ball bond is well-matched with the system. As frequency increases, impedance mismatch effects also increase. Matching each trace to the wire bonded MMIC/CCA can be time consuming if a CCA has many transitions. In addition, it may not be feasible to model every interface. Also, if the simulation is not accurate or the physical connection does not match the simulation, it can be time consuming to have to re-spin a CCA.

SUMMARY

Embodiments of the disclosure provide method and apparatus for using wire bonding equipment to form a series of stacked balls, which can be referred to as stud bumps, to additively form interconnects on the surface of a printed wiring board, circuit card, MMIC, etc., where the stud bumps can have a selected impedance. For example, a number and/or size of the stacked balls can be selected to tune capacitance of the connection, which may have an inductive component, so that the impedance is substantially resistive.

Example wire bonding equipment allows a high degree of control of certain parameters to enable precise impedance matching and adjustment of impedance. By increasing the diameter of the ball on the trace, for example, capacitance can be increased. A number of stacked balls can also be selected to achieve a desired impedance. In some embodiments, ball stacks can be used to provide impedance matching for a coaxial interface. In other embodiments, ball stacks can be used to provide impedance matching for a connection to a MMIC. In addition, if there is a fabrication issue that results in a connection impedance that is out of specification, the ball bond parameters may be adjusted to compensate for the fabrication error to achieve compliance.

In one aspect, an assembly comprises: an interconnection comprising a stack of wirebond balls having a selected impedance. An assembly can further include one or more of the following features: the interconnection comprises a wirebond, the wirebond balls have a size configured for the selected impedance, the size comprises a radius, the stack comprises a number of wirebond balls configured for the selected impedance, the wirebond balls comprise a material selected for the selected impedance, the wirebond balls comprise a material selected for the mechanical properties, the selected impedance is primarily resistive such that the selected impedance minimizes reactance, the interconnection further includes a wirebond and a first end configured to connect to an integrated circuit, the interconnection further includes a second end configured to connect to a circuit card, and/or the connection comprises an RF coaxial connection and includes a wirebond.

In another aspect, a method comprises: employing an interconnection comprising a stack of wirebond balls having a selected impedance. A method can further include one or more of the following features: the interconnection comprises a wirebond, the wirebond balls have a size configured for the selected impedance, the size comprises a radius, the stack comprises a number of wirebond balls configured for the selected impedance, the wirebond balls comprise a material selected for the selected impedance, the wirebond balls comprise a material selected for the mechanical properties, the selected impedance is primarily resistive such that the selected impedance minimizes reactance, the interconnection further includes a wirebond and a first end configured to connect to an integrated circuit, the interconnection further includes a second end configured to connect to a circuit card, and/or the connection comprises an RF coaxial connection and includes a wirebond.

BRIEF DESCRIPTION OF THE DRAWINGS

The foregoing features of this invention, as well as the invention itself, may be more fully understood from the following description of the drawings in which:

FIGS. 3A-3F show wirebond connections between a MMIC and a circuit board trace with various ball bond configurations in accordance with example embodiments of the disclosure.

DETAILED DESCRIPTION

Figure 1A:
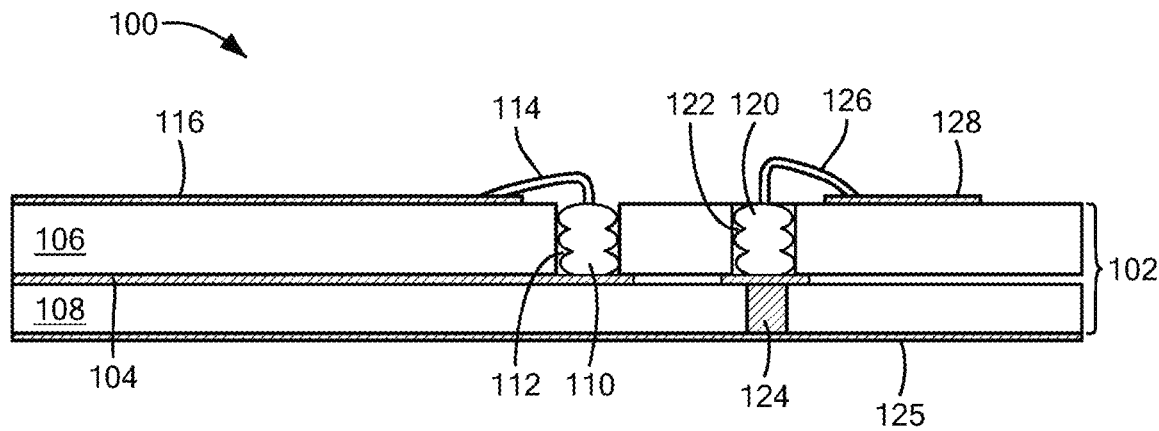
FIG. 1A is a cross-sectional view and FIG. 1B is a top view of an example RF interconnect having wirebond ball stack impedance matching in accordance with example embodiments of the disclosure.
Figure 1B:
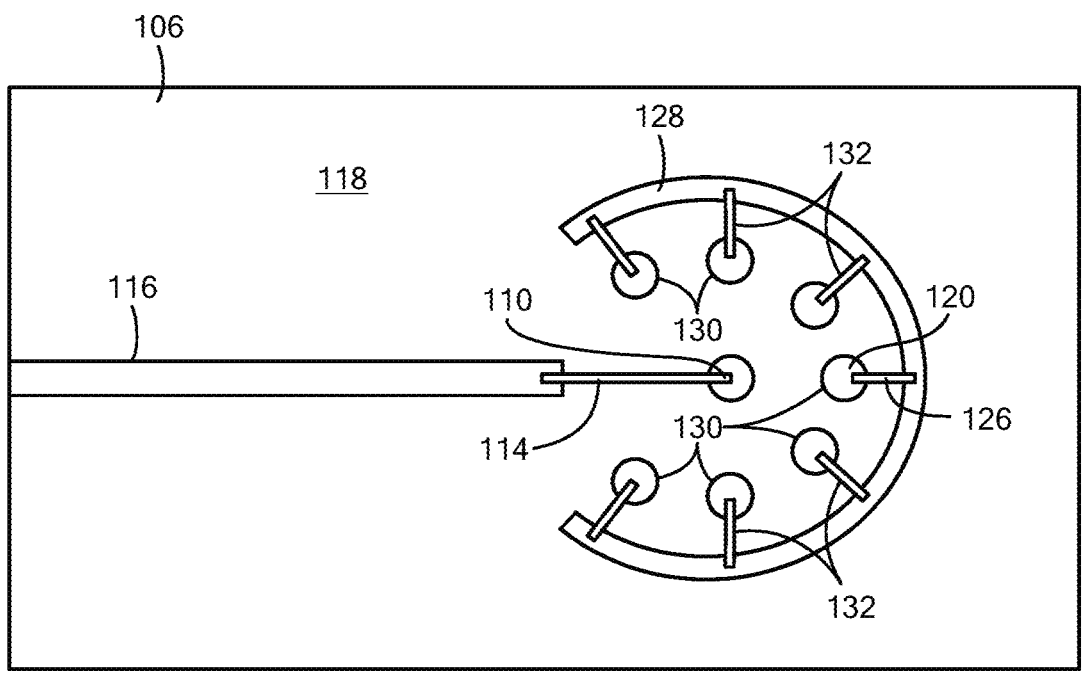

FIGS. 1A and 1B show an example interconnect using ball stacks formed by wire bonding equipment, for example, where the ball stacks have impedance matching in accordance with example embodiments of the disclosure. Example interconnects can be formed for DC printed circuit boards (PCBs), RF boards, digital PCBs, MMICs, coaxial connections and the like. As used herein, the term "circuit card" should be construed broadly to include boards with or without ICs, radiators, PWBs, substrates, such as alumina substrates, microelectronics/microcircuits, and the like.

It is understood that any practical number of ball stacks, through holes, wirebonds, and the like, can be used to meet the needs of a particular application. A desired number of offset ball stacks with balls of a selected geometry can be used to provide impedance matching for a given connection.

FIG. 1A shows a cross-sectional view and FIG. 1B shows a top view of a low-profile RF interconnect system 100 having impedance matching in accordance with example embodiments of the disclosure. In the illustrated embodiment, a coaxial connection is formed. A printed wiring board (PWB) 102 includes a conductive layer 104 between first and second dielectric layers 106, 108. A first ball stack 110 is formed in a first hole 112 in the first dielectric layer 106 forming a connection to the conductive layer 104. A first wirebond 114 is connected to a top of the first ball stack 110 to a trace 116 on a top surface 118 of the PWB. In embodiments, the trace 116 provides a signal path for an RF signal for the coaxial interconnect.

As shown in FIG. 1A, a second ball stack 120 can be formed in a second hole 122 in the first dielectric layer 106. A plated through hole 124, e.g., a via, in the second dielectric layer 108 can provide a connection to a ground plane 125 under the second dielectric layer 108. A second wire bond 126 can be connected from the top of the second ball stack 120 to a ground pad 128.

As best seen in FIG. 1B, the ground pad 128 may form an arc with the first ball stack 110 located generally in the middle of the arc, which partially surrounds the signal-carrying first ball stack 110. In the illustrated embodiment, further ball stacks 110 similar to the second ball stack 120 and further wirebonds 132 similar to the second wirebond 126 are connected to the arcuate ground pad 128. It is understood that the arch in FIG. 1B is notional and the same ground effectiveness could be created by using pads instead of an arch.

In embodiments, the ball stacks 110, 120, 130, can be formed as described to efficiently and accurately form connections for interconnects, such as the illustrated low profile RF interconnect. As used herein, the term "ball stack" refers to a stack of at least two balls stacked on top of each other and bonded to each other where the balls are generated from wire that is melted to form the balls by wire bonding equipment, as described more fully below.

In embodiments, a geometry of the balls in the ball stacks 110, 120, 130 and a number of the balls in the ball stacks is selected to achieve a desired impedance, as described more fully below. A height of a ball stack can correspond to a number of balls in the ball stack.

It is understood that any suitable material can be used for the wire used by the wirebond equipment to form the balls in the ball stacks. Gold is an example material that can be used to form the ball stacks. In some embodiments, the wire can be doped, such as with Palladium. A particular material for the ball stacks can be selected to achieve certain impedance and/or mechanical characteristics. Example mechanical characteristics include tensile strength/elasticity where larger stacks may require material with higher tensile strength, for example.

Figure 2A:
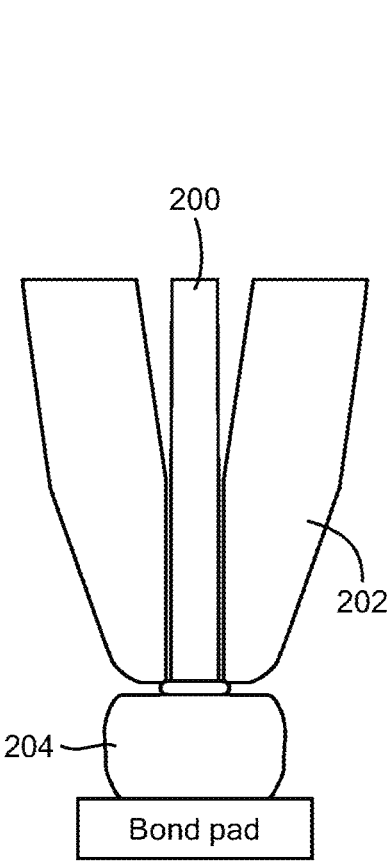
FIGS. 2A and 2B are schematic representations of wirebonding equipment to form ball stacks, such as the ball stacks of FIGS. 1A and 1B.
Figure 2B:
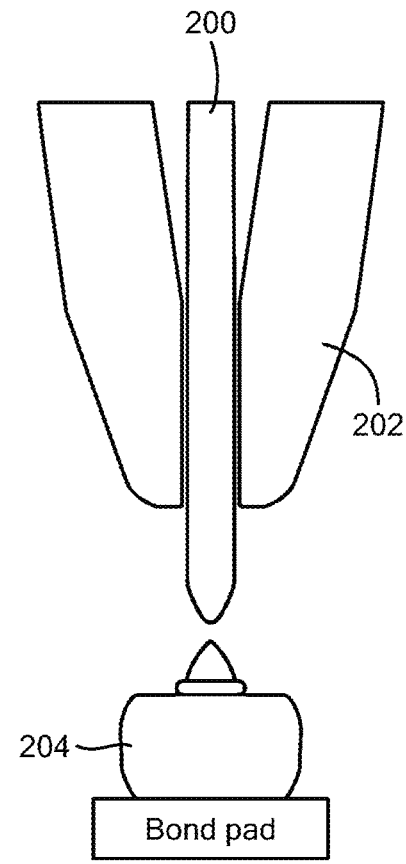
Figure 2C:
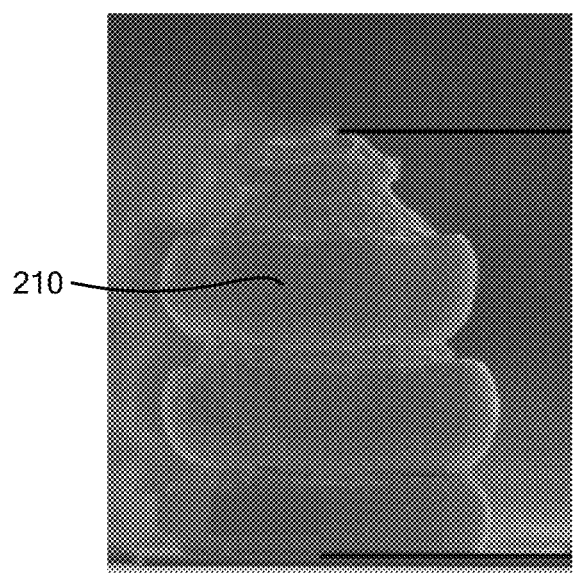
FIG. 2C is a pictorial representation of an example ball stack formed by wirebond equipment.

FIGS. 2A and 2B show a portion of example wirebond equipment that can form ball stacks or stud bumps and FIG. 2C shows an example ball stack formed by the wire bonding system having particular impedance characteristics for a given interconnect. A wire 200 is fed through a needle-like tool 202 which may be referred to as a capillary. A high-voltage electric charge is applied to the wire 200 to melt the wire at the tip of the capillary 202. The tip of the wire 200 forms into a ball 204 because of the surface tension of the molten metal. The ball 204 quickly solidifies and the capillary 202 is lowered to the surface of the chip, which is typically heated to at least 125° C. The machine then pushes down on the capillary 202 and applies ultrasonic energy with an attached transducer. The combined heat, pressure, and ultrasonic energy create a weld between the metal ball and the surface of the chip. A series of balls, which may be referred to as ball stacks 210 or stud bumps, may be stacked on top of each other, as shown in FIG. 2C. The stud bumps can be formed having any practical dimensions to meet the requirements of a particular application.

FIG. 3A shows a schematic representation of a component 300, which is shown as a MMIC in the illustrated embodiment, having wirebond connections to traces on a circuit board 302. In the illustrated embodiment, circuit board traces 304 comprise conductive material in the form of microstrip.

Figure 3B:
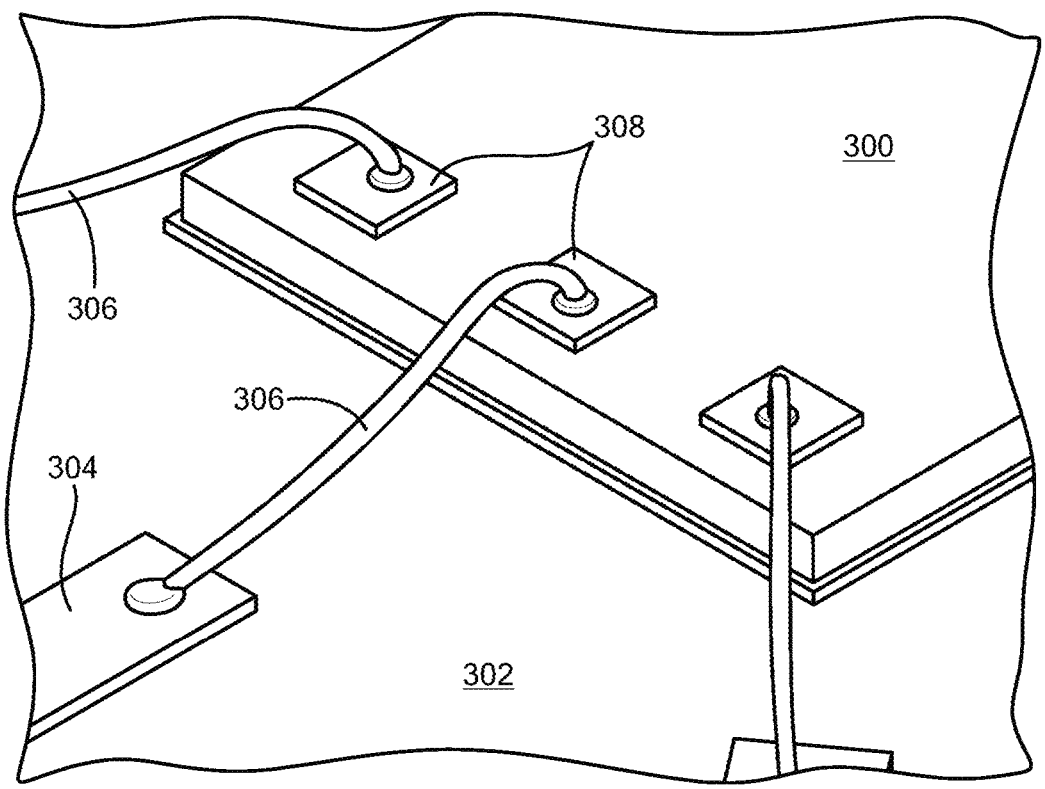
Figure 3C:
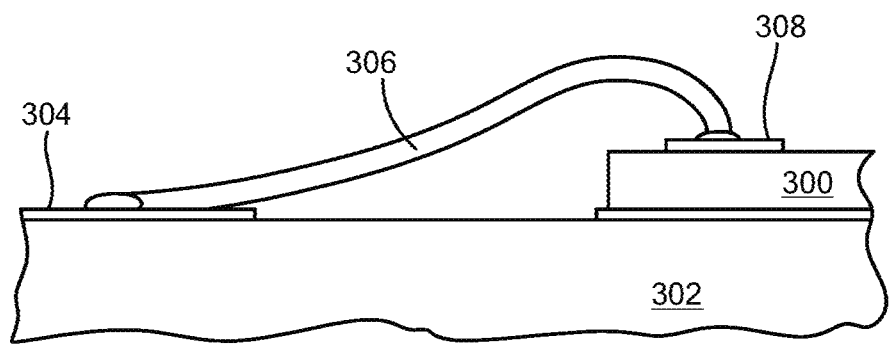

FIGS. 3B and 3C show wirebond connections 306 from a pad 308 on the MMIC 300 to one of the microstrip traces 304 on the circuit board 302 without wirebond balls.

Figure 3D:
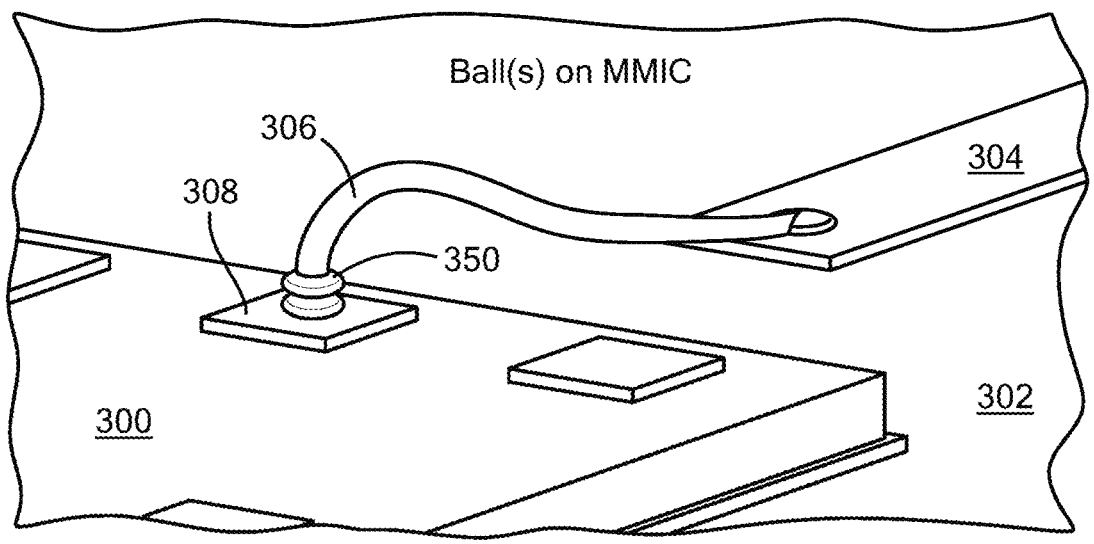
Figure 3E:
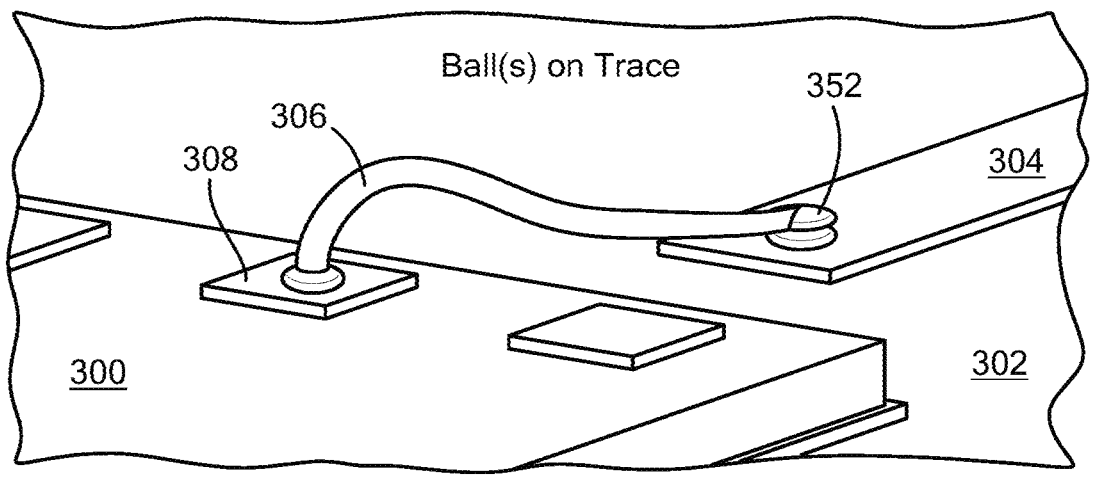
Figure 3F:
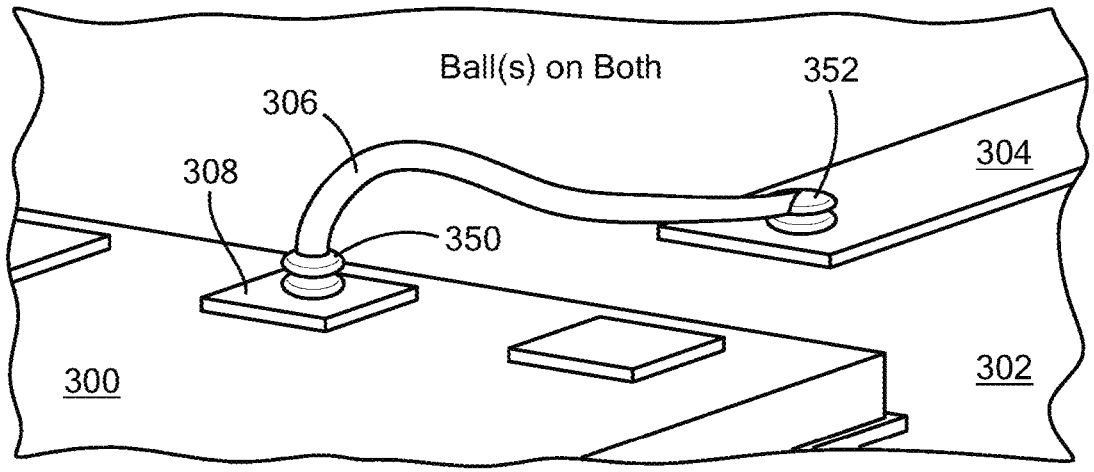

FIG. 3D shows a wirebond connection 306 from a pad 308 on the MMIC 300 to a microstrip trace 304 where the connection at the pad 308 of the MMIC 300 includes a wirebond ball stack 350. FIG. 3E shows a wirebond connection from a pad 308 on the MMIC 300 to a microstrip trace 304 where the connection to the trace includes a wirebond ball stack 352. FIG. 3F shows a wirebond connection from a pad on the MMIC 300 to a microstrip trace 310 where the connection at the pad of the MMIC 300 and the connection to the microstrip trace includes a respective wirebond ball stack 350, 352.

In embodiments, the number of balls in the stacks, e.g., 350, 352, and/or the geometry of the balls can vary to achieve a selected impedance. It is understood that the expected frequency of operation can be taken into account for providing impedance matching for the interconnection.

Figure 4:
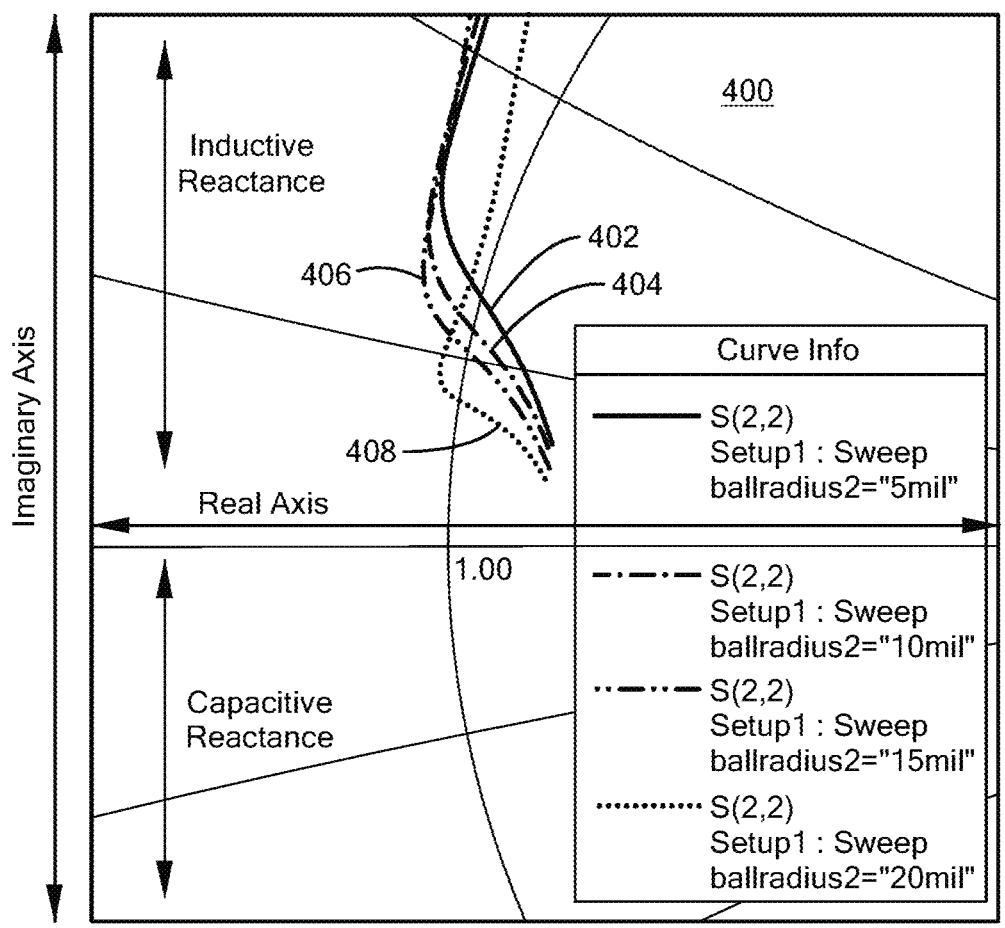
FIG. 4 is a graphical representation of impedance for wirebond balls of various radii.

FIG. 4 shows a graphical representation 400 of the impedance characteristics of wirebond balls having various radii. In the chart, the complex reflection is show for the wirebond interface by an example Smith chart. A wirebond connection impedance has a primarily inductive reactance since it is a long thin wire. It is desirable to alter the impedance to move toward a primarily resistive impedance by increasing the capacitance of the wirebond. This may be achieved by adding area to the trace to which the wirebond is attached. Another way to increase the capacitance is by increasing the wirebond ball bond diameter, as the increase in metallic area will cancel out the inductance. In one particular embodiment, it is desirable to achieve impedance matching to 50 Ohms, i.e., $50\Omega+j0$, which is purely resistive. It is understood that matching can be performed for any practical impedance.

A first curve 402 shows impedance for a wirebond ball having a radius of about 5 mils. As can be seen, the first curve 402 has the smallest ball radius and the largest inductance. A second curve 404 shows impedance for a wirebond ball having a radius of about 10 mils and a third curve 406 shows impedance for a wirebond ball having a radius of about 15 mils. A fourth curve 408 shows impedance for a wirebond ball having a radius of about 20 mils. As can be seen, the fourth curve has the largest ball radius and the smallest inductive, e.g., most resistive, impedance. In general, the wirebond balls can be increased to the capability of the machine.

In embodiments, wirebond balls can have a diameter that can range from about 1 mil to about 30 mils. In example embodiments, stacked balls have an average diameter in the order of 20 mil. In embodiments, a height of example ball stacks can range from about 2 mil to about 90 mil.

In example embodiments, ball stacks are metallic and adhered directly to substrate metallization. Since they are created using a conductive material, they do not have a negative impact in the electrical or thermal performance of attached structures. Ball stacks may be thermosonically welded so as to form a strong metallurgical bond that is difficult to dislodge without a large applied force. In general, ball stacks are relatively inexpensive to manufacture compared to conventional alternatives and can be formed at relatively high rates of speed. In addition, ball stacks do not require separate components, such as washers, stand-offs, physical connector components, etc., which may be needed for conventional alternatives. Further, the geometry of the ball stacks can be controlled by changing wire size, process parameters and ball bonding tools. Once developed, the ball characteristics are extremely repeatable.

While relative terms, such as "vertical," "above," "below," "lower," "upper," "left," "right," and the like, may be used to facilitate an understanding of example embodiments, such terms are not to limit the scope of the claimed invention in any way. These terms, and any similar relative terms, are not to construed as limiting in any way, but rather, as terms of convenience in describing embodiments of the invention.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method of forming an interconnection having a selected impedance, comprising:
   providing a board having a first conductive layer, a first dielectric layer having a first hole in the first dielectric layer that exposes a portion of the first conductive layer, and a conductive trace on a top surface of the first dielectric layer;
   selecting a number of balls in a ball stack to achieve the selected impedance, wherein the number of balls is at least two;
   determining a radius of the balls to achieve desired capacitive and inductance characteristics of the selected impedance, wherein all of the balls have the same determined radius; and
   using wire bonding equipment to melt wire to form the number of balls with the same determined radius on top of each other on the exposed portion of the first conductive layer in the first hole and bonded to each other with the top of the ball stack level with the top surface of the first dielectric layer and then to form a single wirebond interconnection from the top of the ball stack to the conductive trace.

2. The method according to claim 1, wherein the selected impedance is primarily resistive such that the selected impedance minimizes reactance.

3. The method according to claim 1, wherein the ball stack and the single wirebond interconnection connects an integrated circuit and a circuit card.

4. The method according to claim 1, wherein the selected impedance is 50 Ohms.

5. The method according to claim 1, wherein the radius of the wirebond balls ranges from 0.5 mil to 15 mil.

6. The method according to claim 1, wherein the ball stack has a height ranging from 2 mil to 90 mil.

7. The method according to claim 1, wherein the ball stack does not contain solder.

8. The method according to claim 1, wherein the wire is doped.

9. The method according to claim 1, wherein the radius of the balls is determined to increase a capacitance of the ball stack and canceling cancel out an inductance of the single wirebond interconnection.

10. A method of forming an interconnection having a selected impedance, comprising:
    providing a board having a first conductive layer, a first dielectric layer having a first hole in the first dielectric layer that exposes a portion of the first conductive layer, and a conductive trace on a top surface of the first dielectric layer;
    using wire bonding equipment to melt wire to form a plurality of balls with a same determined radius on top of each other on the exposed portion of the first conductive layer in the first hole and bonded to each other to form a ball stack with the top of the ball stack level with the top surface of the first dielectric layer; and then
    using the wire bonding equipment to form a single wirebond interconnection from the top of the ball stack to the conductive trace.

11. The method of claim 10, wherein the number of balls achieves the selected impedance for the ball stack and the radius of the balls achieves desired capacitive and inductance characteristics for the entire ball stack.

12. The method of claim 10, wherein the selected impedance is primarily resistive, wherein the radius of the plurality of balls is determined to minimize reactance.

13. A method of forming an interconnect system having a selected impedance, comprising:
    providing a board having a first conductive layer, a first dielectric layer, a trace on a top surface of the first dielectric layer, a ground pad that forms an arc on the top surface of the first dielectric layer, a first hole in the first dielectric layer positioned at a center of the arc that exposes a portion of the first conductive layer, and a plurality of second holes in the first dielectric layer spaced apart and positioned between the first hole and the arc that expose portions of the first conductive layer,
    selecting a number of balls and a radius of the balls to form a ball stack whose height equals a depth of the first hole and the second holes with the number of balls determining the selected impedance and the radius of the balls achieving desired capacitive and inductance characteristics of the selected impedance for the ball stack,
    using wire bonding equipment to melt wire to form
        a first ball stack in the first hole with the top surface of the first ball stack level with the top surface of the first dielectric layer;
        a first wirebond interconnection from the top of the first ball stack to the conductive trace;
        a plurality of second ball stacks in the plurality of second holes with the top surfaces of the second ball stacks level with the top surface of the first dielectric layer; and
        a plurality of second wirebond interconnections from the tops of the respective plurality of second ball stacks to the ground pad at positions opposite each of the second ball stacks.

* * * * *